United States Patent [19]
Bayer et al.

[11] Patent Number: 5,168,180
[45] Date of Patent: Dec. 1, 1992

[54] LOW FREQUENCY FILTER IN A MONOLITHIC INTEGRATED CIRCUIT

[75] Inventors: Martin J. Bayer; Dejan Mijuskovic, both of Chandler, Ariz.

[73] Assignee: Motorola, Inc., Schaumburg, Ill.

[21] Appl. No.: 871,784

[22] Filed: Apr. 20, 1992

[51] Int. Cl.[5] .......................... H03B 1/04; H03K 3/01
[52] U.S. Cl. ..................................... 307/520; 307/543;
307/296.1; 307/296.6; 307/296.8; 328/167
[58] Field of Search ............... 307/296.1, 296.6, 296.8, 307/520, 542–543; 328/167

[56] References Cited

U.S. PATENT DOCUMENTS

| | | | |
|---|---|---|---|
| 4,684,832 | 8/1987 | Little et al. | 307/520 |
| 4,890,065 | 12/1989 | Laletin | 307/520 |
| 5,051,628 | 9/1991 | Hanna | 328/167 |
| 5,087,891 | 2/1992 | Cytera | 307/296.8 |
| 5,124,631 | 6/1992 | Terashima | 307/296.8 |

Primary Examiner—William L. Sikes
Assistant Examiner—Margaret R. Wambach
Attorney, Agent, or Firm—Robert D. Atkins

[57] ABSTRACT

A low-pass filter circuit is disposed on a monolithic integrated circuit. An operational amplifier receives a reference potential and drives three parallel stacked diode paths into a current supply. One of the stacked diode paths conducts the vast majority of the current allowing the transistors of the other two stacked diode paths to operate in a sub-threshold region and represent an extremely high resistance. The high resistances in combination with a low value capacitor realizes a low-pass filter on the monolithic integrated circuit.

18 Claims, 1 Drawing Sheet

LOW FREQUENCY FILTER IN A MONOLITHIC INTEGRATED CIRCUIT

BACKGROUND OF THE INVENTION

The present invention relates in general to filter circuits and, more particularly, to a low-pass filter for a monolithic integrated circuit.

Monolithic integrated circuits generally require a stable power supply voltage for proper operation. An effective method of stabilizing the power supply voltage is to low pass filter an unregulated power supply into the non-inverting input of an operational amplifier which receives its operating potential from the unregulated power supply. The output of the operational amplifier provides the regulated power supply operating within 0.5 volts of the unregulated power supply voltage. The DC response of the regulated power supply voltage is correlated to variations of the unregulated power supply voltage because the operational amplifier receives a filtered fraction of the unregulated power supply voltage.

The low-pass filter must have a low cut-off frequency, say 30–40 Hz, in order to effectively suppress AC noise from the unregulated power supply voltage. Moreover, to minimize the cost of manufacture, the low-pass filter should be located on the same chip as the circuitry utilizing the stabilized power supply voltage. The resistance and capacitance needed to form the corresponding RC time constant may for example have values of 200 megaohms with a 20 picofarad capacitor, or alternately 1 megaohm and a 4 nanofarad capacitor. The maximum practical limits for on-chip resistors and capacitors is typically 1 megaohm and 20 picofarads, respectively. Thus, the values of resistance and capacitance necessary to make the proper monolithic low-pass filter are impractical with conventional resistors and capacitors used in integrated circuits.

Hence, a need exists for a low-pass filter with a low cut-off frequency for use on a monolithic integrated circuit.

SUMMARY OF THE INVENTION

Briefly stated, the invention comprises a monolithic integrated circuit comprising a low-pass filter having an input receiving a reference potential. The low-pass filter is disposed on the monolithic integrated circuit. An operational amplifier has a first input coupled to an output of the low-pass filter, and an output for providing a regulated voltage. A feedback circuit is coupled between the output of the operational amplifier and a second input of the operational amplifier for providing gain.

In another aspect, the present invention is a low-pass filter circuit comprising an operational amplifier having a first input receiving a reference potential. A first transistor includes a gate and drain coupled together to a first node at the output of the operational amplifier. A second transistor includes a gate and drain coupled together to the first node, and a third transistor having a gate and drain coupled together to a source of the first transistor and to a second input of the operational amplifier. A fourth transistor includes a gate and drain coupled together to a source of the second transistor. A current supply has an output coupled to the sources of the third and fourth transistors, while a first capacitor is coupled between the source of the second transistor and a first power supply conductor.

DETAILED DESCRIPTION OF THE PRIOR ART

Figure 1:
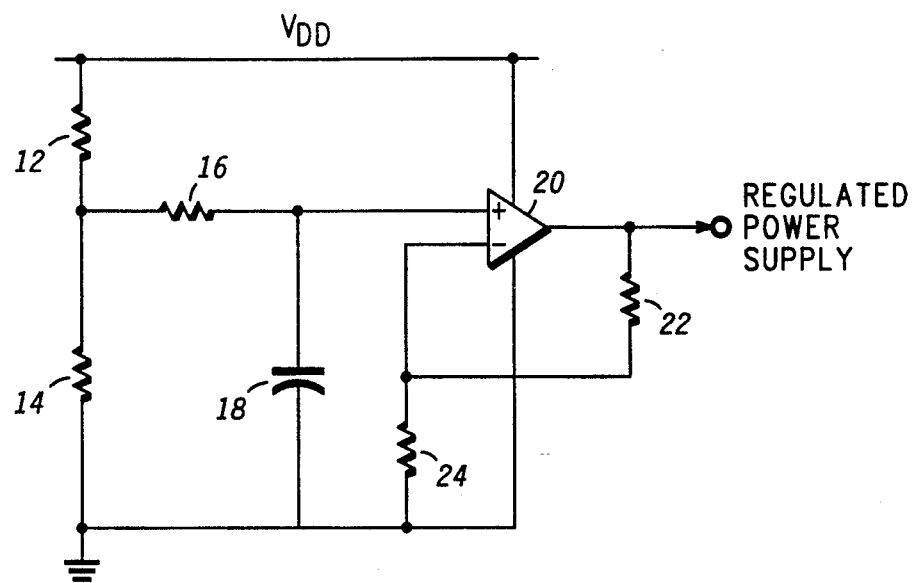
FIG. 1 is a schematic diagram illustrating a conventional RC low-pass filter and power supply regulating operational amplifier.

A conventional power supply regulating circuit 10 is shown in FIG. 1 with voltage dividing resistors 12 and 14 setting up a fractional reference voltage from a positive power supply potential $V_{DD}$ which is then low-pass filtered by resistor 16 and capacitor 18 at the non-inverting input of operational amplifier 20. Feedback resistors 22 and 24 provide gain for operational amplifier 20. The unregulated power supply $V_{DD}$ supplies the operating potential for operational amplifier 20. The regulated power supply voltage provided at the output of operational amplifier 20 tracks the steady state DC value of the unregulated power supply voltage $V_{DD}$. Any AC variation appearing on the unregulated power supply voltage $V_{DD}$ is filtered by resistor 16 and capacitor 18 and thus has virtually no effect on the regulated power supply voltage.

The principal problem with power supply regulating circuit 10 is the realization of resistor 16 and capacitor 18 on a monolithic integrated circuit with an appropriate RC time constant for a cut-off frequency in the range of 30 to 40 Hz. It is desirable to place power supply regulating circuit 10 in its entirety on the single monolithic integrated circuit to reduce manufacturing costs. Because of their physical size, resistor 16 and capacitor 18 must be located off-chip. The resistance and capacitance needed to form the corresponding RC time constant may have values of 200 megaohms with a 20 picofarad capacitor, or alternately 1 megaohm and a 4 nanofarad capacitor. The maximum practical limits for on-chip resistors and capacitors is 1 megaohm and 20 picofarads, respectively. Thus, the physical size of such components makes it impractical to include power supply regulating circuit 10 in its entirety in a monolithic integrated circuit.

DETAILED DESCRIPTION OF THE PREFERRED EMBODIMENT

Figure 2:
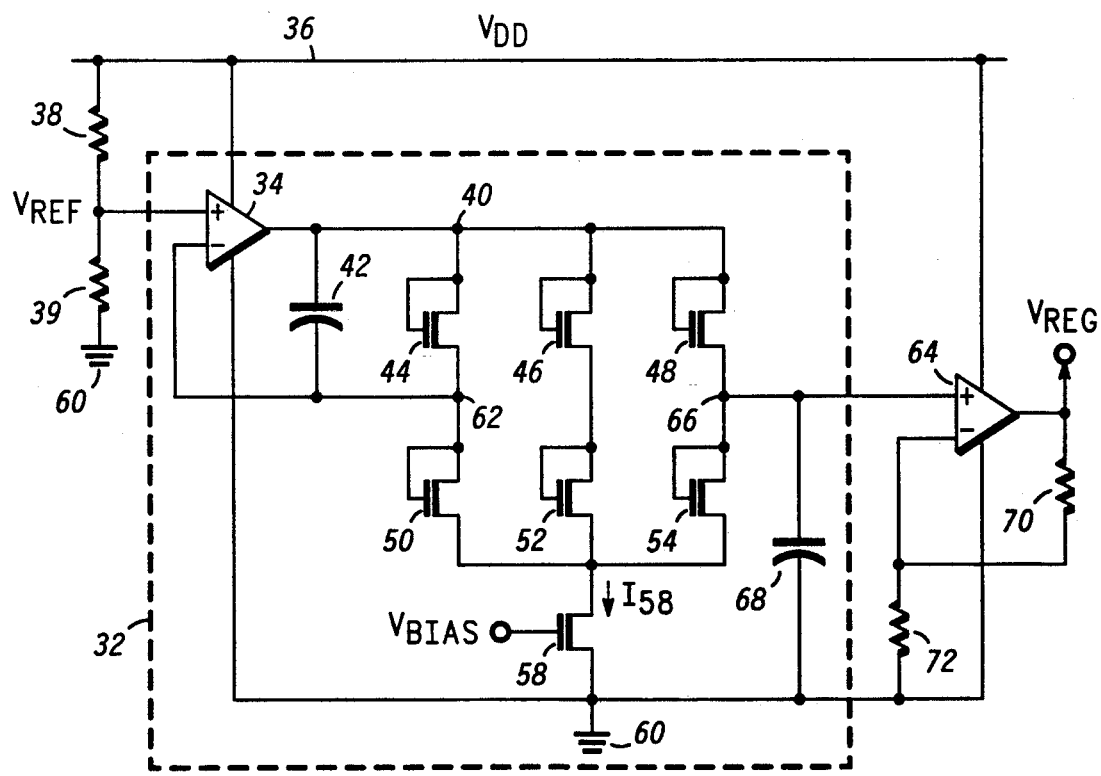
FIG. 2 is a schematic diagram illustrating a low-pass filter and operational amplifier circuit for regulating power supply voltage on a monolithic integrated circuit.

Referring to FIG. 2, there is shown a power supply regulating circuit 30 suitable for manufacture as a monolithic integrated circuit using convention integrated circuit processes. A low-pass filter 32 is made of appropriate physical size for use on a single chip monolithic integrated circuit. Filter 32 includes operational amplifier 34 receiving a reference voltage $V_{REF}$ at its non-inverting input from an unregulated power supply voltage $V_{DD}$ (4.5 to 5.5 volts) at power supply conductor 36. A voltage divider network formed of resistors 38 and 39 develops the reference voltage $V_{REF}$ of approximately 2.5 volts as a fraction of the unregulated power supply voltage $V_{DD}$. The output of operational amplifier 34 at node 40 is coupled through capacitor 42 back to the inverting input of the same for compensation and stable operation. The output of operational amplifier 34 is also coupled to the drains and gates of diode-configured transistors 44, 46 and 48. The sources of transistors 44-48 are coupled to the drains and gates of diode-configured transistors 50, 52 and 54, respectively. The gate and drains of transistors 44-54 operate as anodes, while the sources are the cathodes of the effective diode-configuration.

The sources of transistors 50-54 are coupled together through current source transistor 58 to power supply conductor 60 operating at ground potential. The gate of transistor 58 receives bias potential $V_{BIAS}$ of appropriate level to cause a current $I_{58}$ of say 100 nanoamps to constantly flow through transistor 58. The source of transistor 44 is also coupled to inverting input of operational amplifier 34 at node 62. The source of transistor 48 is coupled to the non-inverting input of operational amplifier 64 at node 66. Capacitor 68 is coupled between node 66 and power supply conductor 60. Resistors 70 and 72 are coupled in the feedback path of operational amplifier 64 for providing gain. The output of operational amplifier 64 is a regulated power supply voltage $V_{REG}$ for providing an operating potential to circuitry (not shown) on the same monolithic integrated circuit. Operational amplifiers 34 and 64 each receive unregulated operating potentials from power supply conductors 36 and 60.

The operation of power supply regulating circuit 30 proceeds as follows. Operational amplifier 34 by its natural operation provides an output voltage at node 40 to drive node 62 to a voltage level equal to the reference voltage $V_{REF}$ at its non-inverting input such that the differential voltage across operational amplifier 34 is substantially zero. Transistors 44, 48, 50 and 54 are matched devices with equal gate widths, say 6 microns, and equal gate lengths, say 100 microns. Diode-configured transistors 46 and 52 are made proportionally larger, for example, 1000 times larger. Transistor 46 may have a gate width 33 times the gate width of transistor 44 and a gate length 33 times smaller than transistor 44. Thus, while transistors 46 and 52 conduct approximately 1000 times more current than transistors 44, 48, 50 and 54, each still occupies substantially the same area.

The 100 nanoamp current $I_{58}$ provided by current source transistor 58 is divided between the three stacked diode paths formed of transistor 44 and 50, transistors 46 and 52 and transistors 48 and 54, respectively. Due to their smaller gate width to length ratio, transistors 44 and 50 and transistors 48 and 54 each conduct approximately 100 picoamps which is about 1/1000 of the current through transistors 46 and 52. Transistors 46 and 52 conduct approximately 99.8 nanoamps for the remainder of current $I_{58}$. With such a small value of current, transistors 44 and 50 and transistors 48 and 54 operate in a sub-threshold region and represent very high impedances, say 800 megaohms each. Transistors 48 and 54 in parallel have an equivalent resistance of 400 megaohms which, in combination with 10 picofarads for capacitor 68, results in a 39 Hz cut-off frequency for low-pass filter 32.

Due to the symmetrical configuration of transistors 44 and 50 and transistors 48 and 54, the voltage at node 66 is equal to the voltage at node 62 which in turn is equal to the reference voltage $V_{REF}$. The regulated power supply voltage $V_{REG}$ typically operates within 0.5 volts of $V_{DD}$ as an amplified version of the voltage at node 66 by way of resistors 70 and 72 in the feedback path of operational amplifier 64.

From a DC standpoint, if the unregulated power supply voltage $V_{DD}$ increases, the reference voltage $V_{REF}$ increases proportionately as does the output voltage of operational amplifier 34. The voltages at nodes 62 and 66 increase accordingly causing a corresponding increase in the regulated power supply voltage $V_{REG}$. A DC drop in the unregulated power supply voltage $V_{DD}$ causes a decrease in the regulated power supply voltage $V_{REG}$ in a similar manner. For AC variations in the unregulated power supply voltage $V_{DD}$, the noise appears at the non-inverting input and output of operational amplifier 34. The noise also appears at node 62 since it is a high impedance point connected back to the inverting input of operational amplifier 34. However, the AC noise does not appear at node 66 because of the filtering action of capacitor 68 and the effective high resistances of transistors 48 and 54 operating in their sub-threshold region.

A key feature of the present invention is the use of three parallel stacked diode paths formed by transistors 44 and 50, transistors 46 and 52 and transistors 48 and 54, respectively, to form a high impedance for low-pass filter 32. Two of the stacked diode paths (transistors 44 and 50 and transistors 48 and 54) conduct matched currents of extremely small magnitudes such that the transistors operate in a sub-threshold region and attain effective resistances on the order of 800 megaohms. The parallel 5 combination of transistors 48 and 54 provide a high resistance 400 megaohms allowing capacitor 68 to have a small value to save space on the chip. The third stacked diode path conducts the vast majority of the current allowing current supply transistor 58 to operate at a practical current level. Low-pass filter 32 may thus be realized on the same monolithic integrated circuit as operational amplifiers 34 and 64 and the circuitry using the regulated power supply voltage $V_{REG}$.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claim is:

1. A monolithic integrated circuit, comprising:
    a low-pass filter having an input receiving a reference potential and having an output, said low-pass filter being disposed on the monolithic integrated circuit, said low-pass filter including,
    (a) a first operational amplifier having first and second inputs and an output at a first node, said first input receiving said reference potential,
    (b) a first transistor having a gate, a drain and a source, said gate and drain being coupled together to said first node,
    (c) a second transistor having a gate, a drain and a source, said gate and drain being coupled together to said first node,
    (d) a third transistor having a gate, a drain and a source, said gate and drain being coupled together to said source of said first transistor and to said second input of said first operational amplifier,
    (e) a fourth transistor having a gate, a drain and a source, said gate and drain being coupled together to said source of said second transistor, and
    (f) current supply means having an output coupled to said sources of said third and fourth transistors;

a second operational amplifier having first and second inputs and an output, said first input being coupled to said output of sad low-pass filter, said output providing a regulated voltage; and feedback means coupled between said output of said second operational amplifier and said second input of said second operational amplifier for setting gain.

2. The monolithic integrated circuit of claim 1 wherein said low-pass filter further includes:
   a first capacitor coupled between said source of said second transistor and a first power supply conductor;
   a fifth transistor having a gate, a drain and a source, said gate and drain being coupled together to said first node; and
   a sixth transistor having a gate, a drain and a source, said gate and drain being coupled together to said source of said fifth transistor, said source being coupled to said output of said current supply means.

3. The monolithic integrated circuit of claim 2 wherein said fifth and sixth transistors have a gate width to gate length ratio larger than said first, second, third and fourth transistors allowing said fifth and sixth transistors to conduct more current than said than said first, second, third and fourth transistors.

4. The monolithic integrated circuit of claim 3 wherein said first, second, third and fourth transistors operate in a sub-threshold region.

5. The monolithic integrated circuit of claim 4 further including a second capacitor coupled between said first node and said first input of said second operational amplifier.

6. The monolithic integrated circuit of claim 5 wherein said current supply means includes a seventh transistor having a gate, a drain and a source, said drain being coupled to said sources of said third, fourth and sixth transistors, said gate receiving a bias potential, said source being coupled to said first power supply conductor.

7. The monolithic integrated circuit of claim 6 further including first and second resistors serially coupled between said first power supply conductor and a second power supply conductor for developing said reference potential.

8. A low-pass filter circuit, comprising:
   an operational amplifier having first and second inputs and an output at a first node, said first input receiving a reference potential;
   a first transistor having a gate, a drain and a source, said gate and drain being coupled together to said first node;
   a second transistor having a gate, a drain and a source, said gate and drain being coupled together to said first node;
   a third transistor having a gate, a drain and a source, said gate and drain being coupled together to said source of said first transistor and to said second input of said operational amplifier;
   a fourth transistor having a gate, a drain and a source, said gate and drain being coupled together to said source of said second transistor;
   current supply means having an output coupled to said sources of said third and fourth transistors; and
   a first capacitor coupled between said source of said second transistor and a first power supply conductor.

9. The low-pass filter circuit of claim 8 wherein said low-pass filter further includes:
   a fifth transistor having a gate, a drain and a source, said gate and drain being coupled together to said first node; and
   a sixth transistor having a gate, a drain and a source, said gate and drain being coupled together to said source of said fifth transistor, said source being coupled to said output of said current supply means.

10. The low-pass filter circuit of claim 9 wherein said fifth and sixth transistors have a gate width to gate length ratio larger than said first, second, third and fourth transistors allowing said fifth and sixth transistors to conduct more current than said than said first, second, third and fourth transistors.

11. The low-pass filter circuit of claim 10 wherein said first, second, third and fourth transistors operate in a sub-threshold region.

12. The low-pass filter circuit of claim 11 further including a second capacitor coupled between said first node and said second input of said operational amplifier.

13. The monolithic integrated circuit of claim 12 wherein said current supply means includes a seventh transistor having a gate, a drain and a source, said drain being coupled to said sources of said third, fourth and sixth transistors, said gate receiving a bias potential, said source being coupled to said first power supply conductor.

14. The low-pass filter circuit of claim 13 further including first and second resistors serially coupled between said first power supply conductor and a second power supply conductor for developing said reference potential.

15. A low-pass filter circuit, comprising:
   an operational amplifier having first and second inputs and an output at a first node, said first input receiving a reference potential;
   a first diode having an anode coupled to said first node and having a cathode;
   a second diode having an anode coupled to said first node and having a cathode;
   a third diode having an anode coupled to said first node and having a cathode;
   a fourth diode having an anode coupled to said cathode of said first diode and to said second input of said operational amplifier and having a cathode;
   a fifth diode having an anode coupled to said cathode of said second diode and having a cathode;
   a sixth diode having an anode coupled to said cathode of said third diode and having a cathode;
   current supply means having an output coupled to said cathodes of said fourth, fifth and sixth diodes; and
   a first capacitor coupled between said cathode of said third diode and a first power supply conductor.

16. The low-pass filter circuit of claim 15 further including a second capacitor coupled between said first node and said second input of said operational amplifier.

17. The low-pass filter circuit of claim 16 wherein said current supply means includes a first transistor having a gate, a drain and a source, said drain being coupled to said cathodes of said fourth, fifth and sixth diodes, said gate receiving a bias potential, said source being coupled to said first power supply conductor.

18. The low-pass filter circuit of claim 17 further including first and second resistors serially coupled between said first power supply conductor and a second power supply conductor for developing said reference potential.

* * * * *